United States Patent [19]

Doehler et al.

[11] Patent Number: 4,479,455
[45] Date of Patent: Oct. 30, 1984

[54] PROCESS GAS INTRODUCTION AND CHANNELING SYSTEM TO PRODUCE A PROFILED SEMICONDUCTOR LAYER

[75] Inventors: Joachim Doehler, Union Lake; Kevin R. Hoffman, Sterling Heights; Timothy D. Laarman, Almont; Gary M. DiDio, Drayton Plains; Therese McDonough, Detroit, all of Mich.

[73] Assignee: Energy Conversion Devices, Inc., Troy, Mich.

[21] Appl. No.: 475,289

[22] Filed: Mar. 14, 1983

[51] Int. Cl.³ ............................................. C23C 13/10
[52] U.S. Cl. .................................. 118/718; 118/719; 118/723; 118/724; 427/255.5; 427/39; 427/85
[58] Field of Search ............... 118/900, 718, 719, 723, 118/50.1, 724; 427/255.5, 39, 85

[56] References Cited

U.S. PATENT DOCUMENTS

| | | | |
|---|---|---|---|
| 3,441,454 | 4/1969 | Shaikh | 118/900 X |
| 3,660,179 | 5/1972 | Desmond et al. | 118/900 X |
| 3,893,876 | 7/1975 | Akai et al. | 118/729 X |
| 4,400,409 | 8/1983 | Izu et al. | 427/255.5 X |

FOREIGN PATENT DOCUMENTS 72226  2/1983  European Pat. Off. .

Primary Examiner—John D. Smith
Assistant Examiner—Bernard F. Plantz
Attorney, Agent, or Firm—Marvin S. Siskind; Ronald W. Citkowski

[57] ABSTRACT

A process gas introduction and channeling system, for use with apparatus adapted to produce photovoltaic devices by depositing semiconductor layers onto continuously moving substrate material. The deposition apparatus preferably includes at least one deposition chamber having (1) a region in which process gases are decomposed and (2) a manifold from which process gases are introduced to flow through the downstream decomposition region. In the preferred embodiment, as the process gases flow through the decomposition region, they are disassociated and recombined under the influence of an electromagnetic field. The species and combinations of process gases thus formed are deposited onto the substrate material. The process gas introduction and channeling system described herein, is adapted to direct the process gases introduced into each of the at least one deposition chamber to pass through the decomposition region thereof in a direction substantially parallel to the direction of travel of the substrate material, whereby substantially uniform semiconductor layers are deposited atop the entire surface of the substrate material.

10 Claims, 6 Drawing Figures

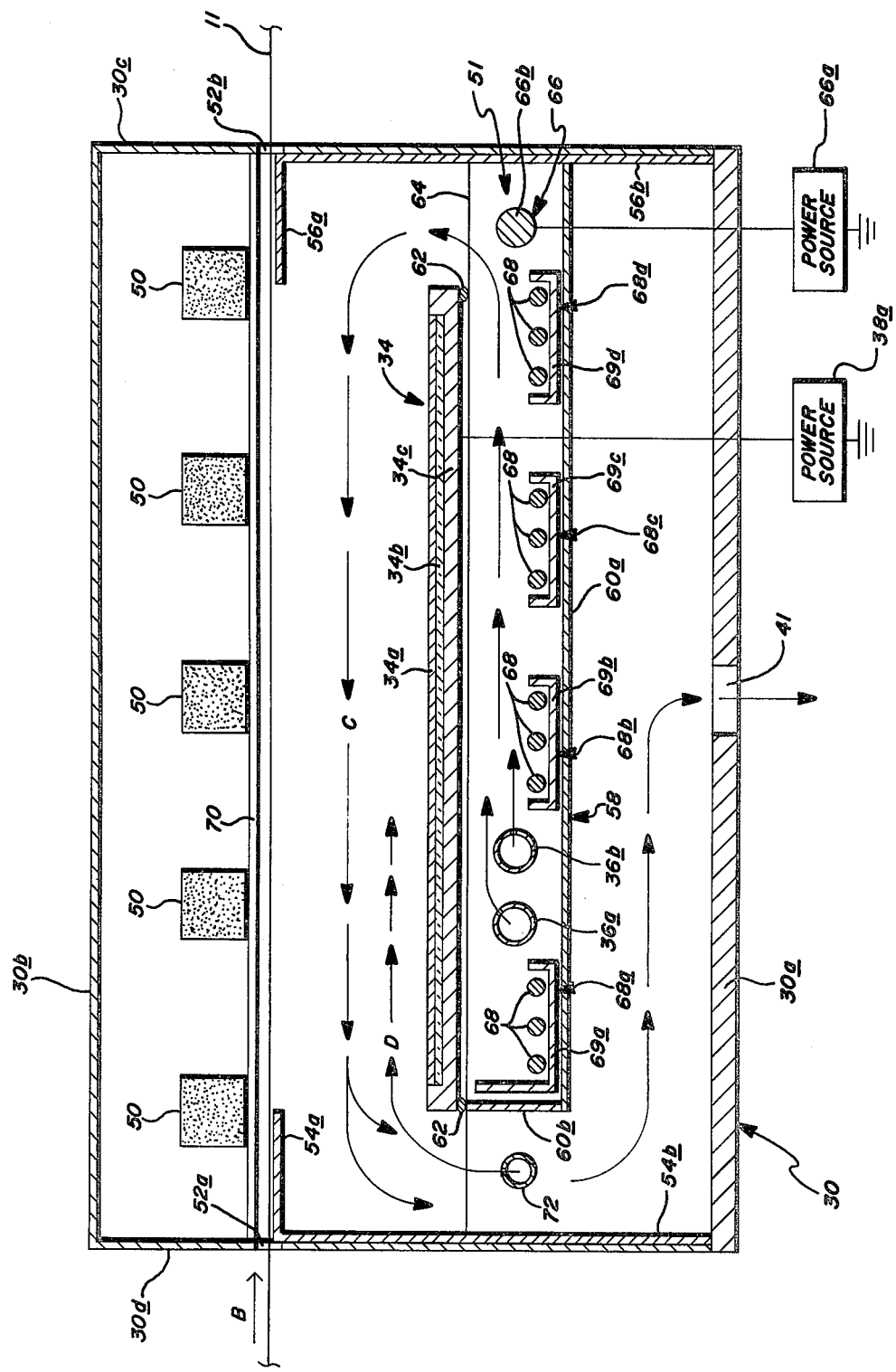

PROCESS GAS INTRODUCTION AND CHANNELING SYSTEM TO PRODUCE A PROFILED SEMICONDUCTOR LAYER

FIELD OF THE INVENTION

This invention relates generally to deposition apparatus for continuously producing photovoltaic devices, and more particularly to a process gas introduction and channeling system for directing process gases through the deposition chambers of the apparatus in a direction substantially parallel to the direction of substrate material travel, whereby a semiconductor layer of substantially uniform composition is deposited across the entire surface of the substrate material.

BACKGROUND OF THE INVENTION

This invention relates to apparatus for continuously producing photovoltaic devices on a substrate by depositing successive semiconductor layers in each of at least one deposition chamber through which the substrate continuously travels. In the preferred embodiment, the deposition of amorphous semiconductor layers is accomplished by glow discharge deposition techniques in which the process gases are decomposed and recombined into as yet not fully understood molecular species and compounds under the influence of an electromagnetic field. The composition of the amorphous semiconductor layers deposited onto the substrate is dependent upon, not only the particular process gases introduced into each of the deposition chambers, but also the particular molecular structure of the species and compounds at the time of deposition. It is therefore important to carefully control, not only the composition of the process gases introduced into the deposition chamber, but also the molecular structure of the semiconductor material deposited across the entire surface area of the substrate. To the end of controlling the composition of the process gases, the deposition apparatus is sealed from the atmosphere, pumped to low pressures, heated to high temperatures, flushed with a gas such as hydrogen, silane or argon prior to initiation of the glow discharge deposition process, and equipped with a precathode assembly for removing contaminants from walls of the chamber and impurities from the process gases and initiating the disassociation and recombination of the process gases. The concept of a precathode assembly has been fully disclosed in U.S. patent application Ser. No. 452,224 filed Dec. 12, 1982, entitled UPSTREAM CATHODE ASSEMBLY, and assigned to the assignee of the instant patent application. While the precathode assembly referred to above solved the problem of uniformity of deposited semiconductor layers in static or batch-type glow discharge deposition systems, lack of uniformity of the deposited semiconductor layers in deposition systems employing a continuously moving substrate was only partially improved. Although said patent application Ser. No. 452,224 includes an embodiment depicting process gas flow in a direction substantially parallel to the direction of travel of the web of substrate material (see FIG. 6 thereof), the disclosure therein neither mentions nor suggests (1) the use of said parallel process gas flow in combination with a profile gas to obtain the deposition of profiled semiconductor layers, or (2) providing said parallel process gas flow in a direction opposite to the direction of travel of the web of substrate material. It is to the end of further improving the uniformity of semiconductor layers deposited onto a continuously moving substrate that the present invention is directed. It is to the additional end of depositing profiled semiconductor layers that the instant invention is also directed.

In order to understand the problem of depositing semiconductor films exhibiting uniform optical, electrical and chemical characteristics, it is necessary to describe, in greater detail, the process gas introduction systems of prior art deposition apparatus for depositing semiconductor material, as well as to accentuate the differences between static or batch-type systems and continuous systems. In previous deposition systems, whether batch or continuous, the process gases were (1) introduced, at spaced intervals, along one transverse edge of the substrate; (2) drawn, by a vacuum pump, transversely across the deposition surface of substrate where a cathode or antenna energized by electromagnetic energy developed an electromagnetic field in the region defined between the deposition cathode or antenna and the substrate (hereinafter referred to generally as the "decomposition region" and specifically as the "plasma region"); (3), upon entering the electromagnetic field, disassociated and recombined into an ionized plasma made up of species and compounds of the originally introduced process gases; and (4) deposited onto the heated deposition surface of the substrate.

However, deposition systems which include a moving substrate, even when equipped with the previously described composition controlling devices such as precathode assemblies, have been found to deposit semiconductor material adjacent the upstream section of the substrate (that section of the substrate first contacted by the process gases) which exhibits different (nonuniform) optical, electrical and chemical characteristics than the semiconductor material deposited over a more downstream portion of the deposition surface of the substrate (that section of the substrate later contacted by the process gases). The differing optical, electrical and chemcial characteristics are believed to be primarily attributable to the introduction of process gases in a direction transverse to the direction of travel of the substrate. More particularly, and referring specifically to FIG. 3A, when process gases are introduced and made to flow transversely across the substrate 11, in the direction depicted by arrow A (the substrate 11 is moving in the direction depicted by arrow B), deposition of the semiconductor material begins at edge 11a of the substrate 11 and proceeds thereacross to opposite edge 11b. It is believed to be because (1) certain of the process gases introduced into the deposition chamber are deposited onto the substrate more rapidly than others, thereby partially depleting the downstream gas mixture, and (2) the chemical combinations and bonding formations of the process gases change with the length of time the process gases are subject to the effects of the electromagnetic field, that the optical, electrical and chemical properties of the deposited semiconductor layer change with a corresponding transverse change of position across the width of the substrate 11 (assuming that all other deposition parameters such as gas and substrate temperature are constant). Obviously, the direction of introduction of process gases as related to uniformity of deposited semiconductor material is irrelevant in batch systems, however, the direction of process gas introduction as related to uniformity of deposited semiconductor material becomes significant with systems which employ a moving substrate. Note that in the mass production of photovoltaic devices, a web of substrate material is continuously fed through the chambers for the deposition thereonto of semiconductor layers. If the deposited material at the downstream end is electrically, optically or chemically inferior, it may be severed from the deposited upstream material. While in this manner the overall efficiency of the photovoltaic devices is not harmed, the severed material represents considerable economic waste.

Accordingly, and referring to FIG. 3B, it is the principle object of the present invention to provide a deposition system wherein the process gases are introduced into the deposition chamber so as to flow across the substrate 11 in a direction, depicted by arrows C, which is substantially parallel to the direction of travel of the substrate 11, depicted by arrow B. Note that, while the process gases are illustrated as flowing in a direction parallel, but opposite to the direction of substrate movement, the gases could also flow parallel and in the same direction as the direction of substrate movement without departing from the spirit and scope of the present invention. In either event, it has been found that by introducing the process gases in a direction substantially parallel to the direction of travel of the substrate 11, the semiconductor material deposited thereonto, although "graded" (slices of the material taken in a direction parallel to the plane of the substrate vary in homogeneity with respect to one another) is substantially "uniform" (slices of material taken in a direction perpendicular to the plane of the substrate, which slices comprise an aggregation of the graded layers, exhibit substantially similar chemical, optical and electrical properties). This is believed to be due to the fact that all of the process gases adjacent any arbitrarily selected line which extends across the entire transverse width of the moving substrate 11 have been subjected to the effects of the electromagnetic field for substantially identical lengths of time. The species and compounds formed from those disassociated and recombined process gases, being at substantially identical stages of disassociation and recombination, are therefore deposited onto the entire surface of the substrate as a film of substantially uniform semiconductor material.

More particularly and still referring to FIG. 3B, imaginary line D—D has been arbitrarily selected to extend across the entire transverse width of the moving substrate 11 at a location downstream of the point of entry of the process gases, while line E—E has been arbitrarily selected to extend across the entire transverse width of the moving substrate 11 at a location upstream of line D—D. As the process gases flow parallel to the path of travel of the substrate 11, depicted by arrow B, and arrive at line D—D, certain ones of the species and compounds, formed from the disassociation and recombination of the process gases under the influence of the electromagnetic field are deposited onto the substrate 11. Since line D—D is adjacent the side of the substrate 11 first entering the deposition chamber (note again the direction B of substrate travel) and certain constituents of the process gases are inherently deposited more rapidly than others, it is likely that the more rapidly deposited constituents are at least partially depleted from the process gases arriving at line D—D, thereby resulting in a different composition of semiconductor material deposited onto the substrate adjacent line D—D than the semiconductor material deposited adjacent line E—E. Further, since the nondeposited process gases adjacent line E—E have not been subjected to the electromagnetic field for as long a period of time as those process gases adjacent line D—D, these process gases have not as yet been disassociated and recombined into substantially identical species and compounds, thereby also contributing to the deposition of differing compositions of semiconductor material. However, in contrast to a deposition system employing a transverse flow of process gases across the substrate 11 in which the optical, chemical and electrical properties of the deposited material along the width of the substrate would vary, the parallel process gas introduction and channeling system of the instant invention deposits uniform semiconductor material across the entire surface of the substrate.

As should now be clear, the uniformity of deposited material is provided because the process gases at any given point across the transverse width of the substrate (such as at any point along line D—D or at any point along line E—E) have been subjected to the electromagnetic field for substantially identical periods of time and, consequently, have disassociated and recombined into substantially identical species and compounds. Accordingly, a layer of semiconductor material formed from the species and compounds present in the plasma adjacent line D—D is continuously deposited atop the entire surface of the substate 11 adjacent the substrate entry side of the deposition chamber, and a layer of semiconductor material formed from the species and compounds present in the plasma adjacent line E—E is continuously deposited atop the entire surface of the semiconductor material previously deposited adjacent line D—D atop the entire surface of the substrate 11 adjacent the substrate exit side of the deposition chamber. The semiconductor material deposited onto the substrate 11 in any given deposition chamber is therefore an aggregation of the semiconductor material deposited adjacent an infinite number of hypothetically drawn lines (such as lines D—D and E—E), each line extending across the width of the substrate 11. This aggregation of layers, each of infinitely small cross-sectional thickness and substantially uniform and homogeneous chemical composition, will be referred to hereinafter as "graded" semiconductor layers. While the deposited semiconductor material might be nonuniform and vary in optical, electrical and/or chemical characteristics if a plurality of cross-sectional slices of that deposited material were taken in a direction parallel to the plane of the substrate and those slices were compared, the deposited semiconductor material would be substantially uniform, graded and exhibit similar optical, electrical and chemical characteristics if a plurality of cross-sectional slices were taken in a direction perpendicular to the plane of the substrate and compared.

Finally, note that in the perferred embodiment of the present invention, the deposition apparatus will be described with specific reference to glow discharge deposition apparatus. However, the process gas introducing and channeling system, presented herein, is applicable to any type of deposition system which employs a continously moving substrate onto which decomposed process gases are depositied, whether by glow discharge deposition techniques, chemical vapor deposition techniques, or heat assisted chemical vapor deposition techniques, etc.

Recently, considerable efforts have been made to develop processes for depositing amorphous semiconductor films, each of which can encompass relatively large areas, and which can be doped to form p-type and n-type materials for the production of p-i-n-type devices substantially equivalent to those produced by their crystalline counterparts.

It is now possible to prepare amorphous silicon semiconductor alloys, by glow discharge or vacuum deposition techniques, said alloys possessing (1) acceptable concentrations of localized states in the energy gaps thereof, and (2) high quality electronic properties. These techniques are fully described in U.S. Pat. No. 4,226,898, entitled Amorphous Semiconductor Equivalent to Crystalline Semiconductors, issued to Stanford R. Ovshinsky and Arun Madan on Oct. 7, 1980; by vapor deposition as fully described in U.S. Pat. No. 4,217,374, issued to Stanford R. Ovshinsky and Masatsugu Izu, on Aug. 12, 1980, under the same title; and in U.S. patent application Ser. No. 423,424 entitled Method Of Making Amorphous Semiconductor Alloys And Devices Using Microwave Energy by Standord R. Ovshinsky, David D. Allred, Lee Walter and Stephen J. Hudgens. As disclosed in these patents, it is believed that fluorine introduced into the amorphous silicon semiconductor operates to substantially reduce the density of the localized states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell while the short circuit current remains substantially constant.

Hamakawa et al, reported the feasibility of utilizing Si-H in a configuration which will be defined herein as a cascade type multiple cell. The cascade cell is hereinafter referred to as a multiple cell without a separation or insulating layer there between. Each of the cells was made of an Si-H material of the same band gap as in a p-i-n junction configuration. Matching of the short circuit current ($J_{sc}$) was attempted by increasing the thickness of the cells in the serial light path. As expected, the overall device Voc increased and was proportional to the number of cells.

It is of obvious commercial importance to be able to mass produce photovoltaic devices such as solar cells. However, with crystalline cells mass production was limited to batch processing techniques by the inherent time consuming growth requirements of the crystals. Unlike crystalline silicon which is limited to batch processing for the manufacture of solar cells, amorphous silicon semiconductor alloys can be deposited in multiple layers over large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom; Ser. No. 244,386 filed Mar. 16, 1981 for Continuous Systems For Depositing Amorphous Semiconductor Material; Ser. No. 240,493 filed Mar. 16, 1981 for Continuous Amorphous Solar Cell Production System; Ser. No. 306,146 filed Sept. 28, 1981 for Multiple Chamber Deposition and Isolation system and Method; and Ser. No. 359,825 filed Mar. 19, 1982, for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous semiconductor material, the second chamber is dedicated for depositing an intrinsic amorphous semiconductor material, and the third chamber is dedicated for depositing an n-type amorphous semiconductor material.

It is for use with continuous deposition apparatus such as the systems described in the patent applications cited hereinabove that the process gas introduction and channeling system of the present invention is directed. When equipped with the instant introduction and channeling system, those deposition apparatus are adapted to deposit more uniform layers of semiconductor material than previously possible, and, consequently reduce waste and produce more efficient photovoltaic devices.

The further objects and advantages of the present invention will become clear from the drawings, the claims and the description of the preferred embodiment which follow.

BRIEF SUMMARY OF THE INVENTION

There is disclosed herein a process gas introduction and channeling system adapted to be used in apparatus for continuously depositing semiconductor layers onto substrate material. The apparatus includes at least one dedicated deposition chamber through which substrate material continuously travels, means for introducing process gases into each of the at least one deposition chamber, and means for decomposing the process gases in the region formed between the substrate and the decomposing means. The novel system of the present invention includes channeling means for directing the incoming process gases into each of the at least one deposition chamber to pass through the decomposition region thereof in a direction substantially parallel to the direction of travel of the substrate material, whereby the semiconductor layer deposited across the entire surface of the substrate is substantially uniform. In the preferred embodiment, the decomposition means includes a cathode plate or antenna energized by a source of electromagnetic power generating a plasma in the decomposition region, and the channeling means is adapted to direct the process gases to flow through the decomposition region of each of the at least one deposition chamber in a direction opposite to the direction of travel of the substrate material. The channeling means may further include (1) baffling means about which the incoming process gases are required to flow before entering the decomposition region, (2) a manifold for introducing a dopant process gas mixture downstream of the decomposition region in such a manner that upstream diffusion of the dopant mixture deposits a profiled semiconductor layer onto the substrate material, (3) heating means adjacent the path of travel of the process gases for warming the process gases prior to their passage into the decomposition chamber, (4) a precathode system upstream of the decomposition region for collecting impurities and initially disassociating and recombining the process gases, and (5) a leak-tight shielding maze for directing the process gases from the point of introduction beneath the cathode, through the decomposition region, about the edge of the cathode and through an exit port in the bottom wall of the deposition chamber.

While the process gas introduction and channeling system of the present invention may be used with any deposition apparatus which includes a moving web of substrate material, it is specially designed for use in apparatus adapted to deposit a semiconductor layer in each chamber of at least one triad of deposition chambers through which the substrate material continuously travels. The second chamber of each triad is adapted to deposit an intrinsic semiconductor layer onto the substrate material while the first and third chambers of each triad are adapted to deposit semiconductor layers of opposite conductivities thereonto. Means are provided for introducing process gases into each chamber of the at least one triad, glow discharge means are provided for (1) generating a plasma in the region between the substrate and the glow discharge means, and (2) continuously depositing the semiconductor layers, and channeling means are provided for directing the process gases introduced into each deposition chamber of the at least one triad to pass through the plasma regions thereof in a direction substantially parallel to the direction of travel of the substrate material, whereby successive, substantially uniform semiconductor layers are deposited across the entire surface of the moving substrate material.

BRIEF DESCRIPTION OF THE DRAWINGS

FIG. 5 is an enlarged, cross-sectional view taken along line 5—5 of FIG. 2 illustrating the process gas introduction and channeling system of FIG. 4 and its operative disposition adjacent the deposition cathode and moving substrate in a deposition chamber.

DETAILED DESCRIPTION OF THE DRAWINGS

I. The Photovoltaic Cell

Figure 1:
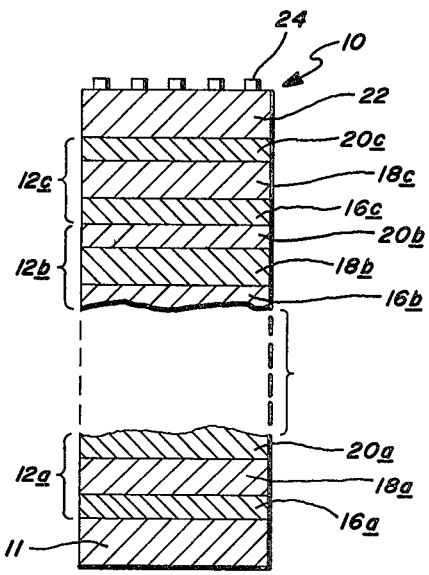
FIG. 1 is a fragmentary, cross-sectional view of a tandem photovoltaic device comprising a plurality of p-i-n type cells, each layer of the cells formed from a semiconductor material.

Referring now to the drawings and particularly to FIG. 1, a photovoltaic cell, formed of a plurality of successive p-i-n layers, each of which includes, preferably, an amorphous semiconductor material, is shown generally by the numeral 10. It is for the production of this type of photovoltaic device, wherein amorphous semiconductor layers are continuously deposited onto a continuously moving substrate in isolated deposition chambers, that the process gas introducing and channeling system of the present invention was developed. Note that the term "amorphous" shall be defined herein as an alloy or material which has long range disorder, although it may have short or intermediate range order or even contain, at times, crystalline inclusions.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum, chrome, or metallic particles embedded within an insulator. Although certain applications may require a thin oxide layer and/or a series of base contacts prior to application of the amorphous material, for purposes of this application, the term "substrate" shall include not only a flexible film, but also any elements added thereto by preliminary processing. Also included within the scope of the prevent invention are substrates formed of glass or a glass-like material on which an electrically conductive electrode is applied.

Each of the cells 12a, 12b and 12c are preferably fabricated with an amorphous semiconductor body containing at least a silicon alloy. Each of the semiconductor bodies includes an n-type conductivity semiconductor, layer 20a, 20b and 20c; an intrinsic semiconductor layer 18a, 18b and 18c; and a p-type conductivity semiconductor layer 16a, 16b and 16c. Note that the intrinsic layer may include traces of n-type or p-type material without forfeiting its characteristic neutrality. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the process gas introduction and channeling system of this invention may also be used with apparatus adapted to produce single or multiple n-i-p cells.

It is to be understood that following the deposition of the semiconductor layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II. The Multiple Glow Discharge Deposition Chambers

Figure 2:
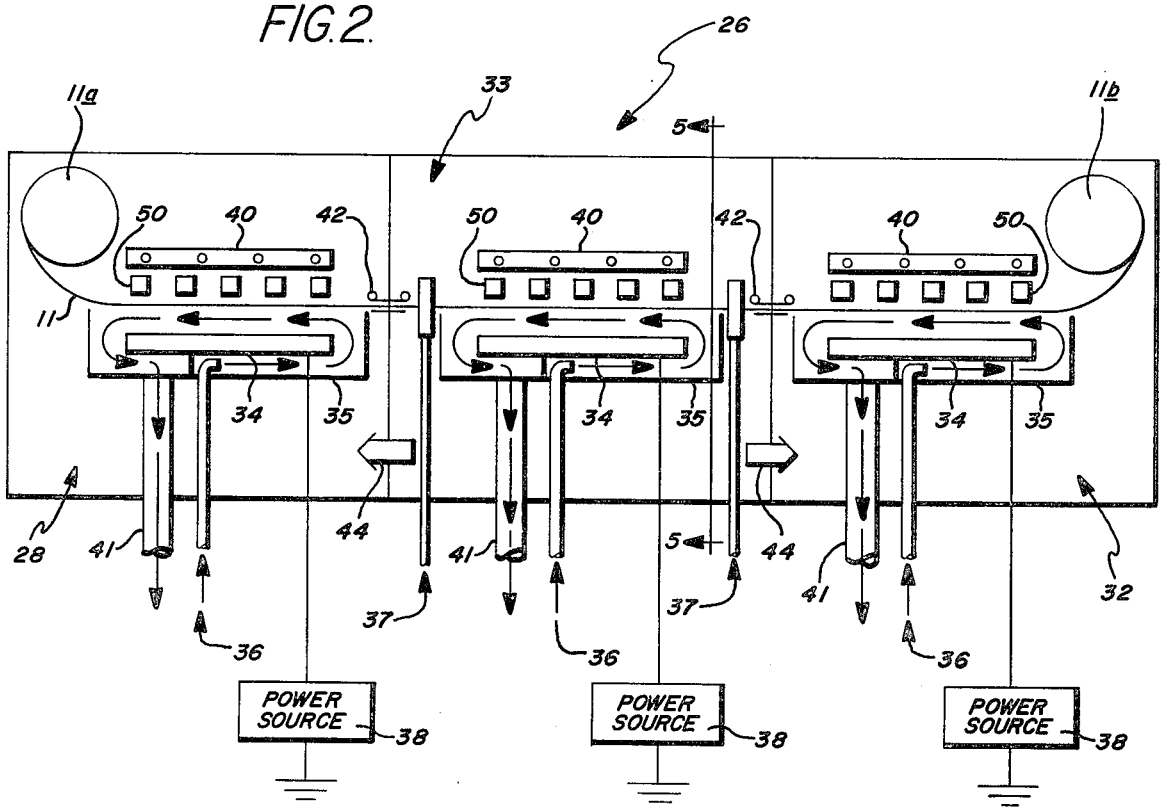
FIG. 2 is a diagrammatic representation of a multiple glow discharge chamber deposition system adapted for use in the continuous production of photovoltaic devices such as the cells shown in FIG. 1.
Figure 3A:
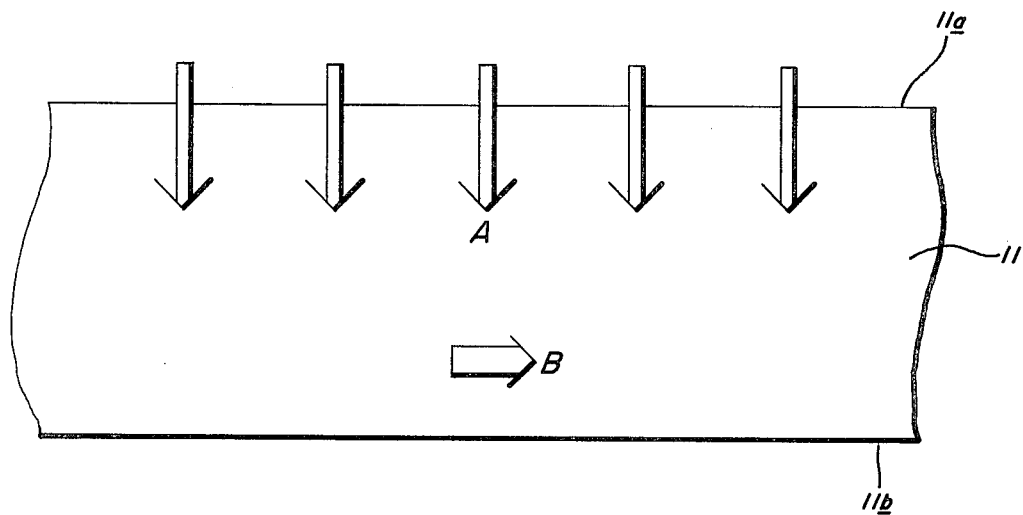
FIG. 3A is an enlarged, bottom plan view of the portion of a web of substrate material traveling through the decomposition region of a prior art deposition chamber illustrating the transverse direction of process gas flow.
Figure 3B:
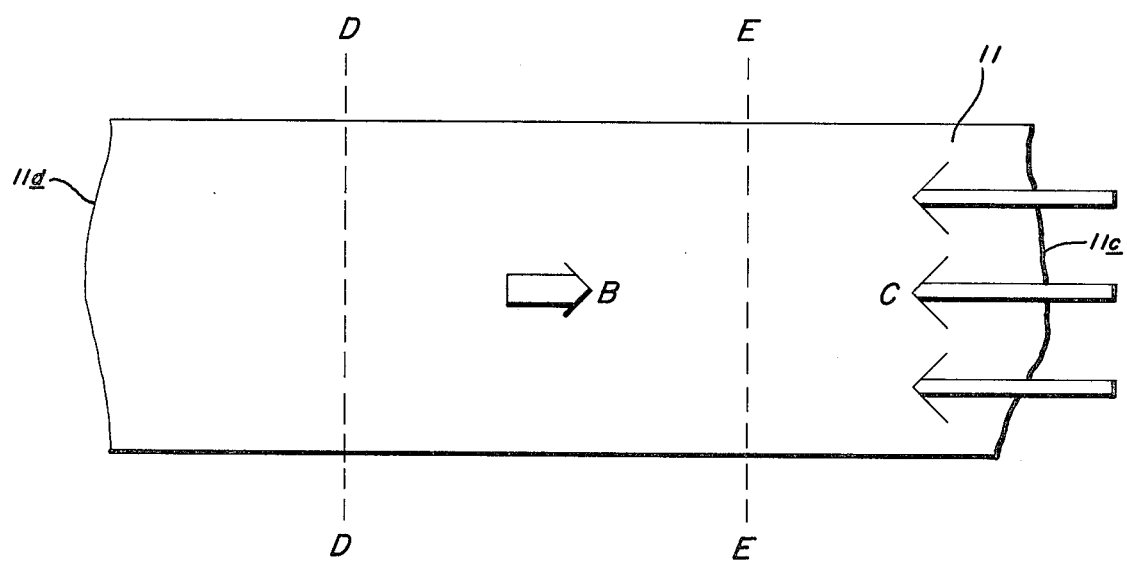
FIG. 3B is an enlarged bottom plan view of the portion of a web of substrate material traveling through the decomposition region of a deposition chamber employing the introduction and channeling system of the instant invention for achieving parallel flow.

Turning now to FIG. 2, a diagrammatic representation of multiple glow discharge chamber deposition apparatus for the continuous production of semiconductor cells is generally illustrated by the reference numeral 26. The apparatus 26 includes a plurality of isolated, dedicated deposition chambers, each chamber of which is interconnected by a gas gate 42 through which (1) sweep gases, and (2) a web of substrate material 11 are adapted to unidirectionally pass.

The apparatus 26 is adapted to mass deposit amorphous semiconductor layers of p-i-n configuration onto the large area surface of the substrate material 11 which is continually fed therethrough. To deposit the semiconductor layers required for producing multiple p-i-n type cells, the apparatus 26 includes at least one triad of deposition chambers. Each triad of deposition chambers comprises: a first deposition chamber 28 in which p-type conductivity semiconductor layer is deposited onto the deposition surface of the substrate 11 as the substrate 11 passes therethrough; a second deposition chamber 33 in which in intrinsic semiconductor layer is deposited atop the p-type layer on the deposition surface of the substrate 11 as the substrate 11 passes therethrough; and a third deposition chamber 32 in which an n-type semiconductor layer is deposited atop the intrinsic layer on the deposition surface of the substrate 11 as the substrate 11 passes therethrough. It should be apparent that (1) although, only one triad of deposition chambers has been illustrated, additional triads or additional invididual may be added to the apparatus to provide the machine with the capability of producing photovoltaic cells having any number of p-i-n type semiconductor layers; (2) the process gas introducing and channeling system of the present invention is equally applicable to any production apparatus which includes a moving substrate onto which a semiconductor layer is deposited; (3) the substrate supply core 11a and the substrate take-up core 11b are shown in the deposition chambers for illustrative purposes only, while in reality the cores would be housed in separate chambers operatively connected to the deposition chambers; (4) although the glow discharge illustrated herein employs cathodes with r.f. power, other energy supplies, such as a.c. power generators, microwave generators and d.c. power generators, may be employed without departing from the spirit of the present invention; and (5) the process gases may be introduced by the introduction and channeling system of the present invention to flow in a direction parallel but opposite to the direction of substrate travel.

Each deposition chamber, 28, 33 and 32 of the triad is adapted to deposit a single semiconductor layer, by glow discharge deposition, onto the electrically conductive substrate 11. To that end, each of the deposition chambers 28, 30 and 32 includes: a cathode 34; a shield 35 disposed about each of the cathodes 34; a process gas supply conduit 36; a radio frequency generator or other a.c. power source 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber. Additionally, an inert sweep gas conduit 37 is disposed on opposed sides of the intrinsic deposition chamber for directing an inert gas toward the dopant deposition chambers.

The supply conduits 36 are operatively associated with the respective cathodes 34 or other decomposition mechanism to deliver process gas mixtures to the plasma, or other decomposition regions created in each deposition chamber between said decomposition mechanism and the substrate 11. The cathode shields 35 are adapted to operate in conjunction with the web of substrate material 11 and the evacuation conduit 41 to confine the process gases within the cathode region of the deposition chambers. To this end, and as will be more fully described hereinafter, the shielding 35 abuts the cathode 34 in a leak-tight manner.

The radio frequency or other similar type of power generator 38 operate in conjunction with the cathodes 34, the radiant heaters 40 and the grounded substrate 11 to form the plasma by disassociating and recombining the elemental reaction gases entering the deposition chambers into deposition species and compounds. These species and compounds are then deposited onto the bottom surface of the substrate 11 as semiconductor layers. The substrate 11 is maintained substantially flat by the plurality of rows of magnetic elements 50 which provide an attractive force urging the substrate 11 upwardly, out of its normal sagging path of travel.

To form the photovoltaic cell 10 illustrated in FIG. 1, a p-type amorphous semiconductor layer is deposited onto the substrate 11 in the dopant deposition chamber 28, an intrinsic amorphous semiconductor layer is deposited atop the p-type layer in the deposition chamber 33 and an n-type amorphous semiconductor layer is deposited atop the intrinisc layer in the deposition chamber 32. As a result, in the preferred embodiment, the apparatus 26 deposits at least three amorphous semiconductor layers onto the substrate 11 with the intrinsic layer deposited in deposition chamber 33 differing in composition from the layers deposited in deposition chambers 28 and 32 by the absence of at least one element which will be referred to as the dopant or doping species.

It is important that each of the semiconductor layers be uniformly deposited across the entire surface of the substrate 11. Therefore, the deposited material must come from species and compounds of the process gases which have been subjected to the electromagnetic field for similar lengths of time, thereby possessing compositional and bonding characteristics adapted to produce uniform semiconductor layers which exhibit a uniform, predetermined range of optical, electrical, and chemical properties across the entire surface of the substrate 11. It is to the end of satisfying the above criteria that the process gas introducing and channeling system of the instant invention is directed.

III. The Process Gas Introducing and Channeling System of the Present Invention

Figure 4:
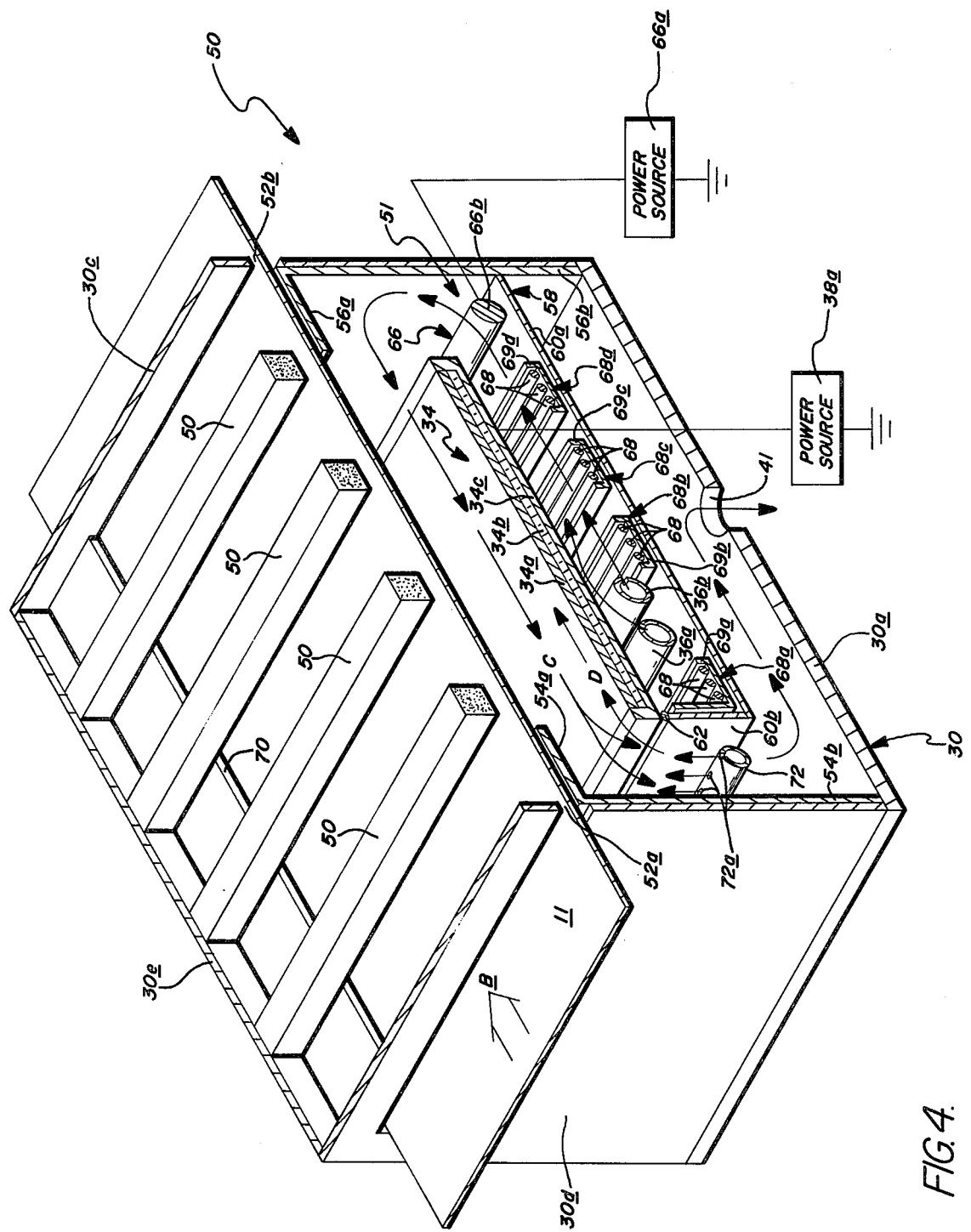
FIG. 4 is an enlarged, fragmentary, cross-sectionalized perspective view of the process gas introduction and channeling system of the present invention, illustrating the disposition of said system relative to the operative components of the deposition apparatus.

The process gas introduction and channeling system of the present invention, fully illustrated in FIGS. 4 and 5, will be generally referenced by the numeral 51. Referring to those figures, the introduction and channeling system 51 is operatively disposed in a deposition chamber which, for the purpose of this discussion, has been arbitrarily selected as the intrinsic deposition chamber 30. Obviously, the introducing and channeling system 51 may and should also be employed in the dopant deposition chambers 28 and 32. As a matter of fact, the exemplary system 51 illustrated in FIG. 5 includes a dopant gas manifold 36b which is particularly adapted for use in the dopant deposition chambers.

Throughout the following description of the preferred embodiment, it is important to note that the direction of flow of process gases through the decomposition region of the deposition chamber 30 is depicted by the reference arrow C, while the direction of travel of the web of substrate material 11 therethrough is depicted by the reference arrow B. The flow of the process gases is, therefore, substantially parallel to the direction of movement of the web of substrate material 11 through the decomposition region of the chamber 30. Obviously, the instant invention is equally well suited for use with apparatus adapted for other deposition techinques, such as chemical vapor deposition, by simply insuring that the direction of the flow of process gases through the apparatus for practicing the particular deposition technique is in a direction substantially parallel to the direction of movement of the web of substrate material.

The deposition chamber 30 is generally a rectangularly-shaped, box-like member which includes a bottom wall 30a, a top wall 30b, side walls 30c and 30d, respectively, and a back wall 30e. Disposed interiorly of the deposition chamber 30 and approximately midway between the upper wall 30b and the lower wall 30a, is a cathode assembly 34. The cathode assembly 34 includes an upper cathode plate 34a, an intermediate glass insulating sheet 34b and a lower, alternating current-receiving sheet 34c. It is the lower sheet 34c which is adapted to receive power from the power source 38a for generating a plasma from the process gases flowing between the cathode assembly 34 and the moving web of substrate material 11. The substrate material 11 is preferably disposed above and in a plane generally parallel to the plane of the cathode assembly 34. More particularly, the web of substrate material 11 is adapted to enter the deposition chamber 30 from a downstream substrate entry port 52a (downstream relative to the flow of process gases through the decomposition region) and exit from the deposition chamber 30 through an upstream substrate exit port 52b. In this manner, the web of substrate material 11 travels through the entry and exit ports, 52a and 52b, just above the generaly horizontally disposed shoulders 54a and 56a of a pair of L-shaped brackets, generally 54 and 56, respectively, which also include generally vertically disposed legs 54b and 56b. The legs 54b and 56b are securely fastened to the deposition chamber side walls 30d and 30c, respectively.

The deposition chamber 30 includes a process gas supply manifold 36a, which is adapted to introduce, for instance, the intrinsic process gases thereinto and a dopant process gas introduction manifold 36b, which is specially adapted to introduce dopant gas mixtures when the process gas introduction and channeling system 50 is disposed in a dopant deposition chamber 28 or 32. The supply manifolds 36a and 36b are both elongated, transversely extending, tubular members having apertures spaced along the length thereof to uniformly introduce gases into the deposition chamber 30 across the entire width of the substrate 11.

The process gas introduction and channeling system 51 further includes an L-shaped, shield 35 extending across the width of the deposition chamber 30 and having a generally horizontally disposed base support member 60a and a generally vertically disposed cathode linking member 60b. The cathode linking member 60b is adapted to closely abut, in leak-tight fashion, the bottom surface 34c of the cathode assembly 34. In order to insure that process gases introduced into the region formed between the cathode assembly 34 and the base support member 60a of the shield 35, the shield-cathode junction includes a compressed Gore-Tex (an extruded teflon material manufactured by W. L. Gore Co.) seal 62. The Gore-Tex seal 62 prevents the leakage of process gases through the non-welded junction formed between the shield 35 and the cathode assembly 34 so as to prevent (1) process gases from leaking through that junction, thereby bypassing the prescribed path of travel to the decomposition region and creating areas of gas stagnation and depletion, and (2) the influx of spent process gases and nondeposited plasma from the decomposition region into the introductory region thereby creating the possibility of having spent process gases and nondeposited plasma pass through the decomposition region a second time. While Gore-Tex has previously been used to provide seals, it is believed that Gore-Tex has never been used to provide a seal in a deposition process involving high temperatures, vacuum pressures, and corrosive environments. The Gore-Tex material has therefore been found (1) to provide a good seal at high temperatures and at vacuum pressures, (2) to be corrosion resistant, (3) to be flexible and compressible, (4) not to out-gas and (5) not to require an O-ring groove to be milled into abutting plates in order to achieve the vacuum seal. The foregoing use of the Gore-Tex seal represents a new use for an existing product of manufacture. However, regardless of the sealing material employed, the cathode assembly 34 is adapted to abut and rest upon a pair of opposite disposed shoulders 64 (only 1 of which is visible), said shoulders extending along the opposed front wall (not shown) and rear wall 30e of the deposition chamber 30.

A precathode assembly, generally 66, is disposed downstream of the process gas and dopant gas introductory manifolds, 36a and 36b, respectively. The precathode system 66 includes a power source 66a, such as an alternating current or direct current generator which is operatively connected to an elongated rod 66b. The cathode rod 66b is adapted to begin the initial disassociation and recombination of process gases flowing therepast, as well as forming part of the system which collects impurities from the process gases and contaminants from the walls of the deposition chamber 30 so as to prevent the contaminants and impurities from being deposited onto the substrate 11 along with the semiconductor material. Note that, while, an elongated rod is used as the precathode in FIGS. 4 and 5, a rectangularly shaped plate, or other configuration, preferably having a substantially large surface area, could be employed without departing from the spirit or scope of the instant invention. Such alternative forms of the precathode assembly 66 are adequately described in the United States patent application entitled "Upstream Cathode Assembly", referred to hereinabove. Note, that it is preferred the precathode 66b be energized by a power source 66a separate from the power source 38a which energizes the deposition cathode 34. By employing the individual power source 66b, a precathode power density which is different from the deposition cathode power density may be achieved.

The introduction and channeling system 51 also includes a plurality of substantially equally spaced banks, 68a–68d, of heating elements, generally 68. Each of the banks 68a–68d includes a heat reflective shield 69a–69d, respectively, to direct the heat toward the gases and the cathode assembly 34. The number and spacing of the banks of heating elements 68a–68d, as well as the number and spacing of individual heating elements 68 in each bank is depicted in FIG. 5, while not critical, should be sufficient to prewarm the process gases flowing therepast to a predetermined temperature. Although not shown in FIG. 5, another array of heating elements, schemmatically depicted in FIG. 2 as 40, is disposed above a plurality of elongated, spaced, ceramic bar magnets 50, which are supported across the width of the deposition chamber 30 atop oppositely disposed and longitudinally extending magnet support shelves 70, (only one of which is illustrated). The upper array of heating elements 40 are adapted to warm the substrate 11 to the predetermined operating temperature, while the bar magnets 50 are adapted to urge the magnetic substrate 11 upwardly, into sliding contact therewith.

Note that the process gas introduction and channeling system 51 of the present invention does not include a "formal" baffle plate arrangement, the manifolds 36a and 36b, the precathode 66b, and the 180° turn which the process gases are forced to make prior to entering the decomposition region, provide an "informal" baffling arrangement. This informal baffling arrangement is important to the deposition of uniform material because it acts to thoroughly mix the incoming process gases before they enter the decomposition region.

Finally, an elongated, traversely extending, profiling gas manifold 72 is positioned in the deposition chamber 30 (1) between the vertical cathode linking member 60b and the vertically disposed bracket leg 54b and (2) downstream of the decomposition region. The profiling manifold 72 includes a plurality of spaced apertures 72a for introducing profiling gases across the entire width of the decomposition region in a direction, depicted by the reference arrow D, substantially parallel to the direction of movement of the web of substrate material 11, but opposite to the direction of the flow of process gases. In this manner, the profiling gases can only reach and travel through the decomposition region by the process of diffusion, which process restricts profiling gases reaching and traveling through the decomposition region to very low levels. Further, the amount of profiling gases present in the decomposition region will vary in the direction D of profiling gas flow. More particularly, the greatest concentration (albiet a very low concentration) of profiling gases is located adjacent the downstream (relative to the direction C of process gas flow) section of the decomposition region. Due to (1) the deposition of some of the profiling gases as they are subjected to the effects of the electromagnetic field, and (2) the difficulty the profiling gases experience in moving against the flow of the process gases and reaching upstream locations within the decomposition region, the concentration of the profiling gases decreases with its upstream movement through the decomposition region. In this manner, it would be obvious that by introducing, for instance, a -dopant gas through the profiling manifold 72, the greatest amount of P-dopant gas will be deposited directly atop the p-doped semiconductor layer just entering the intrinsic deposition chamber 30. As the substrate 11 moves through the decomposition region of the intrinsic chamber, lesser amounts of p-dopant gases are deposited, thereby profiling the intrinsic semiconductor layer with successively lesser amounts of p-doped material from the p-dopant/intrinsic junction to the intrinsic/n-dopant junction. Note that by simply mirror imaging the introducing and channeling system 51, a profiling manifold such as 72 could be employed to provide a source of n-dopant gases for profiling the intrinsic/n-dopant junction.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

What is claimed is:

1. In vacuum deposition apparatus adapted to deposit semiconductor layers, said apparatus including at least one dedicated deposition chamber through which substrate material is adapted to continuously travel; a source of process gases including at least one precursor noncrystalline semiconductor material; means for introducing said process gases into each of said at least one deposition chamber; and means for decomposing the process gases in a decomposition region formed between said substrate material and said decomposing means, whereby a noncrystalline semiconductor layer is continuously deposited onto said substrate material; the improvement comprising, in combination;

channeling means for directing the process gases introduced into each of the at least one deposition chamber to pass through the decomposition region thereof in a direction substantially parallel to the direction of travel of the substrate material;

a source of precursor profiling gas; and means for introducing said dopant profiling gas into the decomposition region of the deposition chamber in a direction of flow opposite the direction of flow of the process gases therethrough, whereby the profiling gas is adapted to diffuse through at least a portion of the decomposition region for depositing a profiled noncrystalline semiconductor layer, said semiconductor layer being substantially uniform across the width of the substrate material.

2. Apparatus as in claim 1, wherein the channeling means is adapted to direct the process gases to flow through the decomposition region of each of the at least one deposition chamber in a direction opposite to the direction of travel of substrate material.

3. Apparatus as in claim 1, wherein the channeling means is adapted to direct the process gases to flow through the decomposition region of each of the at least one deposition chamber in the same direction as the direction of travel of substrate material.

4. Apparatus as in claim 1, wherein heating means are provided, said heating means operatively disposed upstream of the decomposition means for warming the process gases prior to the passage thereof into said decomposition region.

5. Apparatus as in claim 1, wherein the at least one deposition chamber includes an upstream decomposition region adapted to (1) collect impurities from the process gases and contaminants from the chamber walls, and (2) initially disassociate and recombine the process gases.

6. In glow discharge deposition apparatus which includes at least one triad of deposition chambers through each chamber of which substrate material is adapted to continuously travel; the second chamber of each triad is adapted to deposit an intrinsic semiconductor layer onto the substrate material, and the first and third chambers of each triad adapted to deposit semiconductor layers of opposite conductivities thereonto; a source of process gases including at least one precursor noncrystalline semiconductor material; means for introducing said process gases into each chamber of the at least one triad; and means for decomposing the process gases in a decomposition region formed between the substrate material and the decomposing means, whereby a noncrystalline semiconductor layer is continuously deposited onto the substrate material in each deposition chamber of the at least one triad; the improvement comprising, in combination:

channeling means for directing the process gases introduced into each deposition chamber of the at least one triad to pass through the decomposition regions thereof in a direction substantially parallel to the direction of travel of the substrate material;

a source of precursor profiling gas; and means for introducing said dopant profiling gas into the decomposition region of at least the intrinsic deposition chamber in a direction of flow opposite the direction of flow of the process gases therethrough, whereby the profiling gas is adapted to diffuse through at least a portion of the decomposition region for depositing a profiled noncrystalline semiconductor layer, said semiconductor layer being substantially uniform across the width of the substrate material.

7. Apparatus as in claim 6, wherein the channeling means is adapted to direct the process gases to flow through the decomposition region of each deposition chamber in a direction opposite to the direction of travel of substrate material.

8. Apparatus as in claim 6, wherein the channeling means is adapted to direct the process gases to flow through the decomposition region of each deposition chamber in the same direction as the direction of travel of substrate material.

9. Apparatus as in claim 6, wherein heating means are provided, said heating means operatively disposed upstream of the decomposition region of each chamber for warming the process gases prior to the passage thereof into said decomposition regions.

10. Apparatus as in claim 6, wherein each of the deposition chambers further includes an upstream decomposition region adapted to (1) collect impurities from the process gases and contaminants from the chamber walls, and (2) initially disassociate and recombine the process gases.

* * * * *